(12) United States Patent
Song et al.

(10) Patent No.: US 9,768,450 B2
(45) Date of Patent: Sep. 19, 2017

(54) MASK-LESS FABRICATION OF VERTICAL THIN FILM BATTERIES

(71) Applicant: APPLIED MATERIALS, INC., Santa Clara, CA (US)

(72) Inventors: Daoying Song, San Jose, CA (US); Chong Jiang, Cupertino, CA (US); Byung-Sung Leo Kwak, Portland, OR (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/653,730

(22) PCT Filed: Dec. 17, 2013

(86) PCT No.: PCT/US2013/075756
§ 371 (c)(1),
(2) Date: Jun. 18, 2015

(87) PCT Pub. No.: WO2014/099974
PCT Pub. Date: Jun. 26, 2014

(65) Prior Publication Data
US 2015/0325862 A1 Nov. 12, 2015

Related U.S. Application Data

(60) Provisional application No. 61/739,635, filed on Dec. 19, 2012.

(51) Int. Cl.
*B44C 1/22* (2006.01)
*H01M 6/40* (2006.01)
(Continued)

(52) U.S. Cl.
CPC ............. *H01M 6/40* (2013.01); *C23C 14/088* (2013.01); *C23C 14/34* (2013.01);
(Continued)

(58) Field of Classification Search
CPC ............... H01M 6/40; H01M 10/0436; H01M 10/0585; C03C 25/68; C03C 2218/33; B23K 26/08
(Continued)

(56) References Cited

U.S. PATENT DOCUMENTS

2007/0139001 A1 6/2007 Hahn
2008/0032236 A1* 2/2008 Wallace ................. H01M 6/40
430/319

(Continued)

FOREIGN PATENT DOCUMENTS

EP 2434567 A2 3/2012
FR 2956926 A1 2/2011
(Continued)

OTHER PUBLICATIONS

Extended European Search Report Issued Jun. 28, 2016 for Application No. EP 13865636.8.

*Primary Examiner* — Binh X Tran
(74) *Attorney, Agent, or Firm* — Pillsbury Winthrop Shaw Pittman LLP

(57) ABSTRACT

A method of fabricating a thin film battery may comprise: depositing a first stack of blanket layers on a substrate, the first stack comprising a cathode current collector, a cathode, an electrolyte, an anode and an anode current collector; laser die patterning the first stack to form one or more second stacks, each second stack forming the core of a separate thin film battery; blanket depositing an encapsulation layer over the one or more second stacks; laser patterning the encapsulation layer to open up contact areas to the anode current collectors on each of the one or more second stacks; blanket depositing a metal pad layer over the encapsulation layer and the contact areas; and laser patterning the metal pad layer to electrically isolate the anode current collectors of each of the one or more thin film batteries. For electrically (Continued)

non-conductive substrates, cathode contact areas are opened-up through the substrate.

10 Claims, 16 Drawing Sheets

(51) Int. Cl.
    *C23C 14/08*     (2006.01)
    *C23C 14/34*     (2006.01)
    *H01M 4/04*     (2006.01)
    *H01M 10/0585*     (2010.01)
    *H01M 10/04*     (2006.01)

(52) U.S. Cl.
    CPC ..... *H01M 4/0426* (2013.01); *H01M 10/0436* (2013.01); *H01M 10/0585* (2013.01)

(58) Field of Classification Search
    USPC ..................................................... 216/65, 96
    See application file for complete search history.

(56) References Cited

U.S. PATENT DOCUMENTS

| | | |
|---|---|---|
| 2009/0208671 A1 | 8/2009 | Nieh et al. |
| 2010/0261049 A1 | 10/2010 | Kwak et al. |
| 2011/0287296 A1* | 11/2011 | Sabi .................... H01M 2/0212 |
| | | 429/127 |
| 2011/0294015 A1 | 12/2011 | Pirk et al. |
| 2012/0214047 A1 | 8/2012 | Kwak et al. |
| 2013/0248352 A1 | 9/2013 | Jiang et al. |
| 2013/0266741 A1 | 10/2013 | Song et al. |

FOREIGN PATENT DOCUMENTS

| | | |
|---|---|---|
| JP | 4850405 B2 | 1/2012 |
| KR | 10-2010-0130450 | 12/2010 |

* cited by examiner

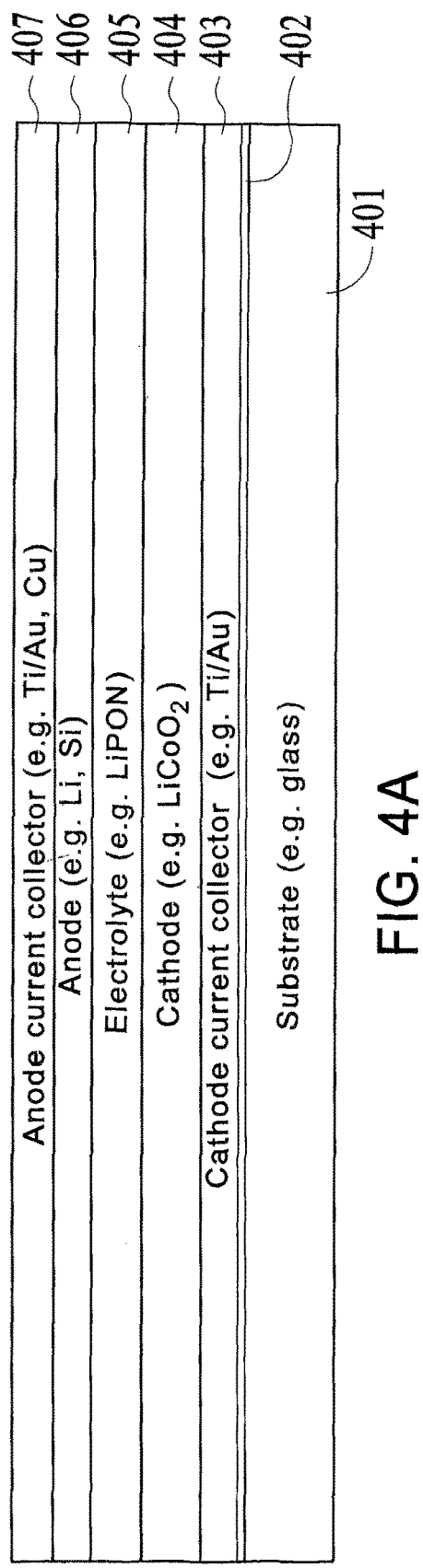
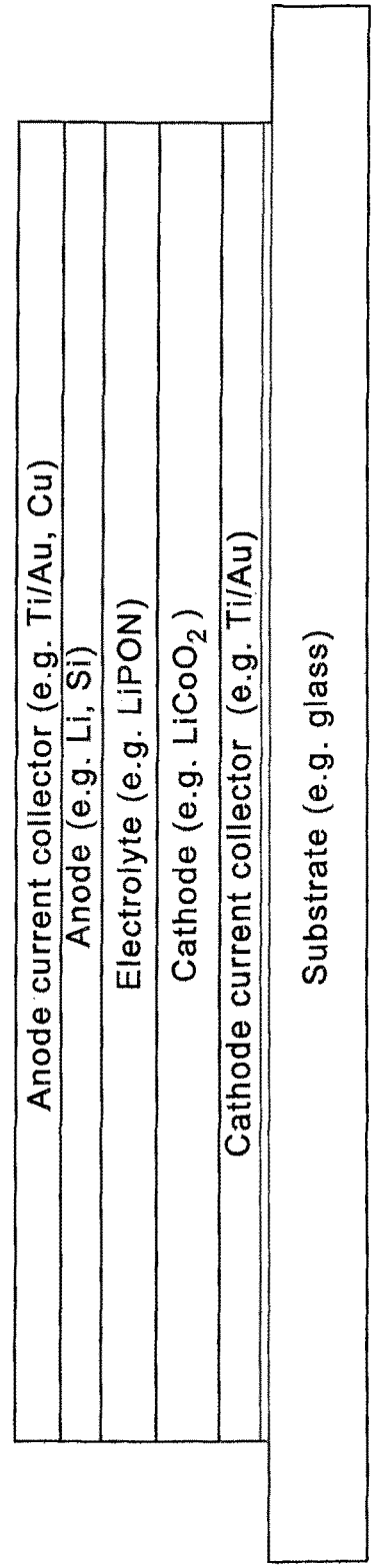
FIG. 4A
FIG. 4B

MASK-LESS FABRICATION OF VERTICAL THIN FILM BATTERIES

CROSS REFERENCE TO RELATED APPLICATIONS

This application is a U.S. National Phase patent application of PCT/US2013/075756, filed Dec. 17, 2013, which claims priority to U.S. Provisional Application No. 61/739,635 filed Dec. 19, 2012, all of which are hereby incorporated by reference in the present disclosure in their entirety.

FIELD OF THE INVENTION

Embodiments of the present invention relate generally to shadow mask-less fabrication processes for thin film batteries.

BACKGROUND OF THE INVENTION

Thin film batteries (TFBs) have been projected to dominate the micro-energy applications space. TFBs are known to exhibit several advantages over conventional battery technology such as superior form factors, cycle life, power capability and safety. FIG. 1 shows a cross-sectional representation of a typical thin film battery (TFB) and FIG. 2 shows a flow diagram for TFB fabrication along with corresponding plan views of the patterned TFB layers. FIG. 1 shows a typical horizontal TFB device structure 100 with anode current collector 103 and cathode current collector 102 are formed on a substrate 101, followed by cathode 104, electrolyte 105 and anode 106; although the device may be fabricated with the cathode, electrolyte and anode in reverse order. Furthermore, the cathode current collector (CCC) and anode current collector (ACC) may be deposited separately. For example, the CCC may be deposited before the cathode and the ACC may be deposited after the electrolyte. The device may be covered by an encapsulation layer 107 to protect the environmentally sensitive layers from oxidizing agents. See, for example, N. J. Dudney, Materials Science and Engineering B 1 16, (2005) 245-249. Note that the component layers are not drawn to scale in the TFB device shown in FIG. 1.

However, there are challenges that still need to be overcome to allow cost effect high volume manufacturing (HVM) of TFBs. Most critically, an alternative is needed to the current state-of-the-art TFB device patterning technology used during physical vapor deposition (PVD) of the device layers, namely shadow masks. There is significant complexity and cost associated with using shadow mask processes in HVM: (1) a significant capital investment is required in equipment for managing, precision aligning and cleaning the masks, especially for large area substrates; (2) there is poor utilization of substrate area due to having to accommodate deposition under shadow mask edges and limited alignment accuracy; and (3) there are constraints on the PVD processes—low power and temperature—in order to avoid thermal expansion induced alignment issues.

In HVM processes, the use of shadow masks (ubiquitous for traditional and current state-of-the-art TFB fabrication technologies) will contribute to higher complexity and higher cost in manufacturing. The complexity and cost result from the required fabrication of highly accurate masks and (automated) management systems for mask alignment and regeneration. Such cost and complexity can be inferred from well-known photolithography processes used in the silicon-based integrated circuit industry. In addition, the cost results from the need for maintaining the masks as well as from throughput limitations by the added alignment steps. The adaptation becomes increasingly more difficult and costly as the manufacturing is scaled to larger area substrates for improved throughput and economies of scale (i.e., HVM). Moreover, the scaling (to larger substrates) itself can be limited because of the limited availability and capability of shadow masks.

Another impact of the use of shadow masking is the reduced utilization of a given substrate area, leading to non-optimal battery densities (charge, energy and power). This is because shadow masks cannot completely limit the sputtered species from depositing underneath the masks, which in turn leads to some minimum non-overlap requirement between consecutive layers in order to maintain electrical isolation between key layers. In addition, there are the inherent alignment limitations that come from inaccuracies in mask fabrication and alignment accuracies of an alignment tool. This alignment inaccuracy is further exacerbated by the thermal expansion mismatch between the substrate and the mask, as well as the differential thermal conditions during the deposition. The consequence of this minimum non-overlap requirement is the loss of cathode area, leading to overall loss of capacity, energy and power content of the TFB (when everything else is the same).

A further impact of shadow masks is limited process throughput due to having to avoid additional thermally induced alignment problems—thermal expansion of the masks leads to mask warping and shifting of mask edges away from their aligned positions relative to the substrate. Thus the PVD throughput is lower than desired due to operating the deposition tools at low deposition rates to avoid heating the masks beyond the process tolerances.

Furthermore, processes that employ physical (shadow) masks typically suffer from particulate contamination, which ultimately impacts the yield.

Therefore, there remains a need for concepts and methods that can significantly reduce the cost of HVM of TFBs by enabling simplified, more HVM-compatible TFB process technologies.

SUMMARY OF THE INVENTION

A novel vertical thin film battery where anode and cathode are electrically connected out from the top film side and bottom substrate, respectively, is described herein. This vertical TFB structure not only increases substrate utilizations and yield but also simplifies the TFB manufacturing process. Note that herein the term cathode is used to describe the electrode where the reduction reaction occurs while the anode, the oxidation reaction, i.e., one electrode will function as both a cathode and an anode, although not simultaneously, depending on which direction the electrochemical reaction is occurring. For example, in one direction, the $LiCoO_2$ layer is a cathode and in the other, an anode.

The present invention utilizes the vertical TFB structure, blanket deposition of TFB layers and ex situ laser patterning of blanket layers to improve yields, throughputs, pattern accuracy and increase in die density. The novel vertical TFB structure may not only increase substrate utilizations and yields but also simplifies the TFB manufacturing process. Blanket layer deposition eliminates the need for shadow masks, which not only removes the high cost of manufacturing and cleaning masks, especially for large area substrates, but also removes any constraint on PVD processes caused by potential thermal expansion induced alignment issues and interaction between the additional magnets and RF PVD process. The concept of all active layers being blanket deposited consecutively on a single substrate without breaking vacuum (except when cathode annealing is necessary after deposition) clearly increases film deposition throughputs and reduces laser ablation steps and challenges. Reduced ambient exposure may also improve the device performance by minimizing the adverse reactions with ambient oxidants upon exposure—hygroscopic LiPON may adsorb/react with ambient $H_2O$ that will likely react with Li during subsequent Li deposition step, creating an undesirable interfacial layer and an additional source of cell impedance. The vertical TFB structure, blanket depositions and ex-situ laser patterning of TFBs improve pattern accuracy, yields and substrate/material usages, and have a great potential to drive the manufacturing cost of TFBs down well below current costs.

According to some embodiments of the present invention, a method of fabricating a thin film battery, may comprise: depositing a first stack of blanket layers on an electrically conductive substrate, the first stack comprising a cathode current collector layer, a cathode layer (annealing the layer as needed), an electrolyte layer, an anode layer and an anode current collector layer; laser die patterning the first stack to form one or more second stacks (each second stack forming the core of a separate TFB); blanket depositing an encapsulation layer over the one or more second stacks; laser patterning the encapsulation layer to open up contact areas to the ACC on each of the one or more separate stacks; repeated blanket depositing of encapsulation layer and subsequent ACC patterning may be repeated as deemed appropriate for permeation blocking requirements; blanket depositing a metal pad layer over the encapsulation layer and the contact areas of the ACCs; and laser patterning the metal pad layer to electrically isolate the ACCs of each of the one or more TFBs—this step may be achieved by laser dicing to obtain individual TFBs.

According to some further embodiments of the present invention, a method of fabricating a thin film battery, may comprise: depositing a first stack of blanket layers on an electrically non-conductive substrate, the first stack comprising (optionally) a die patterning assistance layer, a cathode current collector layer, a cathode layer (annealing the layer as needed), an electrolyte layer, an anode layer and an anode current collector layer; laser die patterning the first stack to form one or more second stacks (each second stack forming the core of a separate TFB); blanket depositing an encapsulation layer over the one or more second stacks; laser patterning the encapsulation layer to open up anode contact areas to the ACC on each of the one or more second stacks; blanket depositing a metal pad layer over the encapsulation layer and the anode contact areas of the ACCs; laser patterning the metal pad layer to electrically isolate the ACCs of each of the one or more TFBs; and opening up, through the substrate, cathode contact areas on the cathode current collector for each of the one or more thin film batteries.

Furthermore, this invention describes tools for carrying out the above methods.

According to yet further embodiments of the present invention, a thin film battery may comprise: a stack of layers on the top surface of an electrically non-conductive substrate, the stack comprising a cathode current collector layer, a cathode layer, an electrolyte layer, an anode layer, and an anode current collector layer; an encapsulation layer completely covering the stack of layers except for at least one opening to the anode current collector layer for making electrical contact to the anode layer; and a metal pad layer making contact to the anode current collector layer at the at least one opening in the encapsulation layer; wherein the substrate has an opening to the cathode current collector for making electrical contact to the cathode layer.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 4A-4G are cross-sectional representations of sequential steps in a second process flow for fabrication of a vertical TFB with a non-conductive substrate, according to some embodiments of the present invention;

DETAILED DESCRIPTION

Embodiments of the present invention will now be described in detail with reference to the drawings, which are provided as illustrative examples of the invention so as to enable those skilled in the art to practice the invention. The drawings provided herein are merely representations of devices and device process flows and are not drawn to scale. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
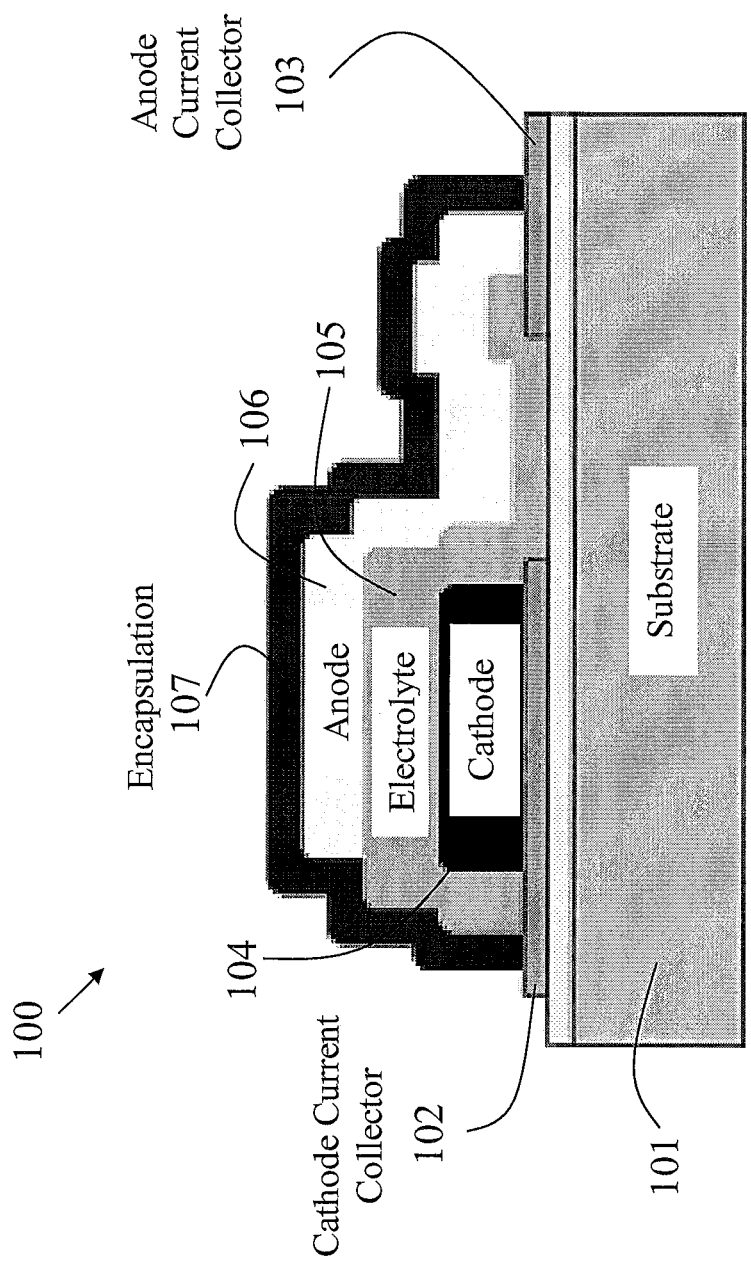
FIG. 1 is a cross-sectional representation of a thin film battery (TFB)
Figure 2:
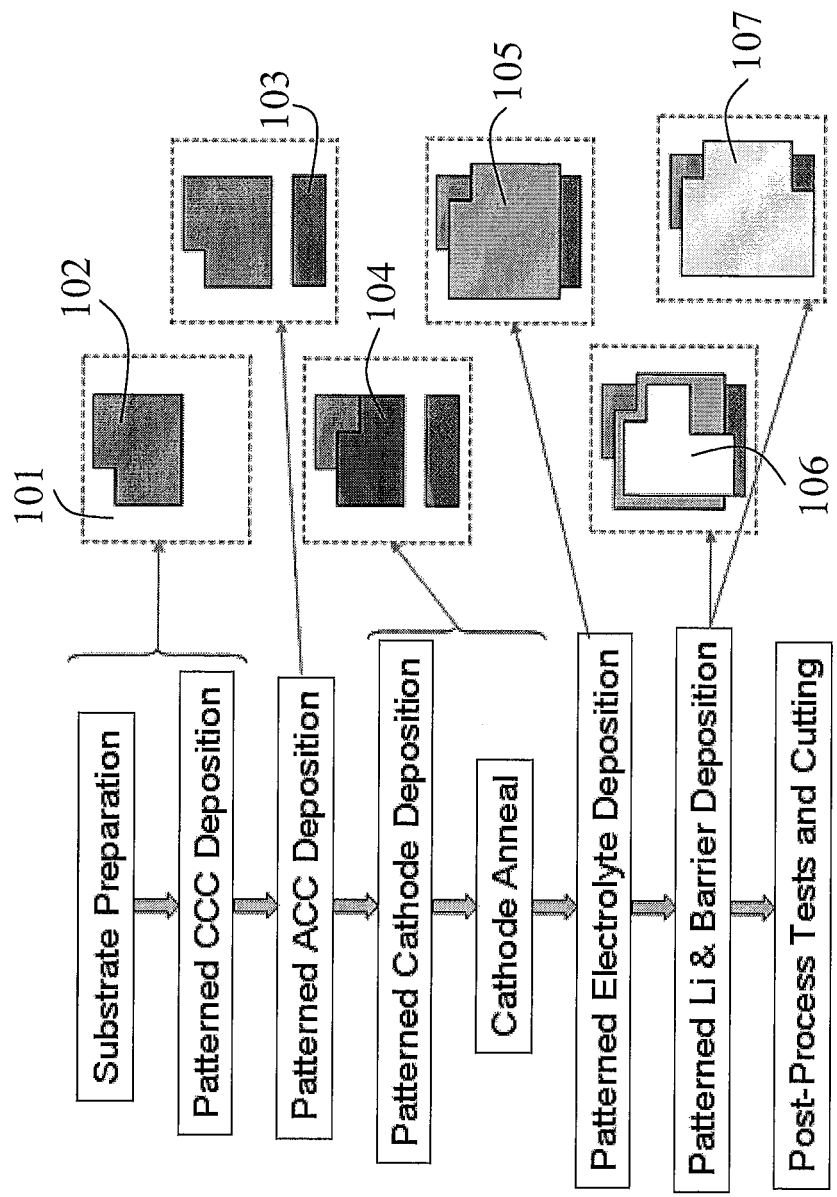
FIG. 2 is a flow diagram for TFB fabrication along with corresponding plan views of the patterned TFB layers.

In conventional TFB manufacturing all layers are patterned using in-situ shadow masks which are fixed to the device substrate by backside magnets, Kapton® tape or by using some fixtures to hold the stack together. Moreover, the anode and cathode current collectors of traditional TFBs (such as the TFB of FIG. 1) are typically connected out on the same side of the device. According to embodiments of the present invention, a vertical TFB cell structure is proposed, where anode and cathode are electrically connected out from the top film side and bottom substrate, respectively. This vertical TFB configuration greatly increases substrate utilization and yield over the traditional TFB configuration. In the present invention, instead of in-situ patterned depositions, blanket depositions without any shadow mask are proposed for all layers in the TFB fabrication, including bonding pad and protection coating layers. The flow may also incorporate processes for bonding, encapsulation and/or protective coating. Patterning of the blanket layers may be by a laser ablation process.

All active layers of the vertical TFB (cathode current collector, cathode, electrolyte, anode, and anode current collector) may be blanket deposited consecutively, possibly without breaking vacuum. This significantly increases film deposition throughputs.

Only three laser steps are necessary for the whole TFB process: the first laser step is to isolate/define the TFB dies, which can be from the backside with low laser fluence; the second laser step is to ablate the encapsulation/Li protection layer to open an area for bonding pad deposition on the ACC; the final laser step is to ablate photoresist and/or substrate from the backside.

According to some embodiments of the present invention, a method of fabricating a thin film battery, may comprise: depositing a first stack of blanket layers on an electrically conductive substrate, the first stack comprising a cathode current collector layer, a cathode layer (annealing the layer as needed), an electrolyte layer, an anode layer and an anode current collector layer; laser die patterning the first stack to form one or more second stacks (each second stack forming the core of a separate TFB); blanket depositing an encapsulation layer over the one or more second stacks; laser patterning the encapsulation layer to open up contact areas to the ACC on each of the one or more separate stacks; repeated blanket depositing of encapsulation layer and subsequent ACC patterning may be repeated as deemed appropriate for permeation blocking requirements; blanket depositing a metal pad layer over the encapsulation layer and the contact areas of the ACCs; and laser patterning the metal pad layer to electrically isolate the ACCs of each of the one or more TFBs—this step may be achieved by laser dicing to obtain individual TFBs.

Figure 3A:
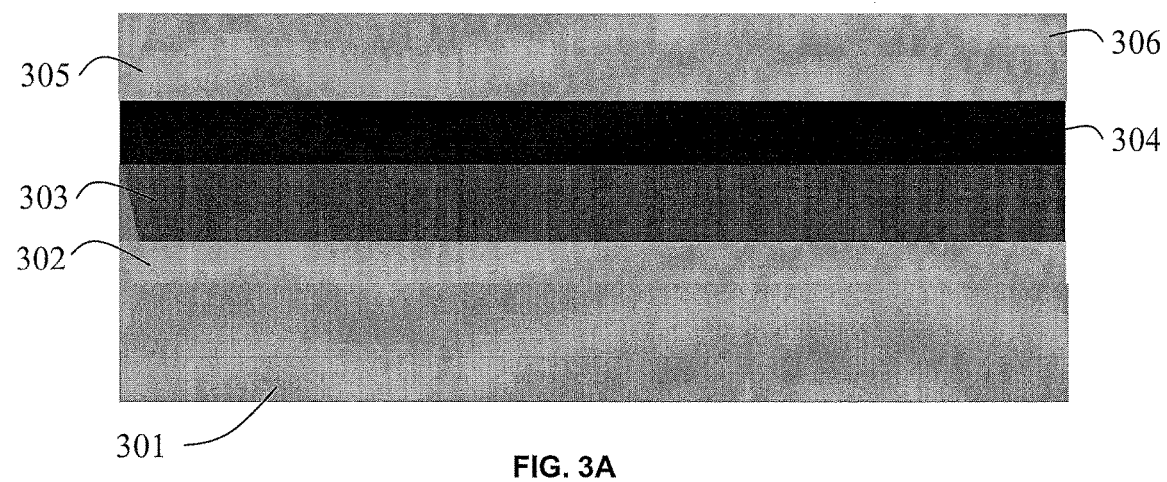
FIGS. 3A-3F are cross-sectional representations of sequential steps in a first process flow for fabrication of a vertical TFB with a conductive substrate, according to some embodiments of the present invention.
Figure 3B:
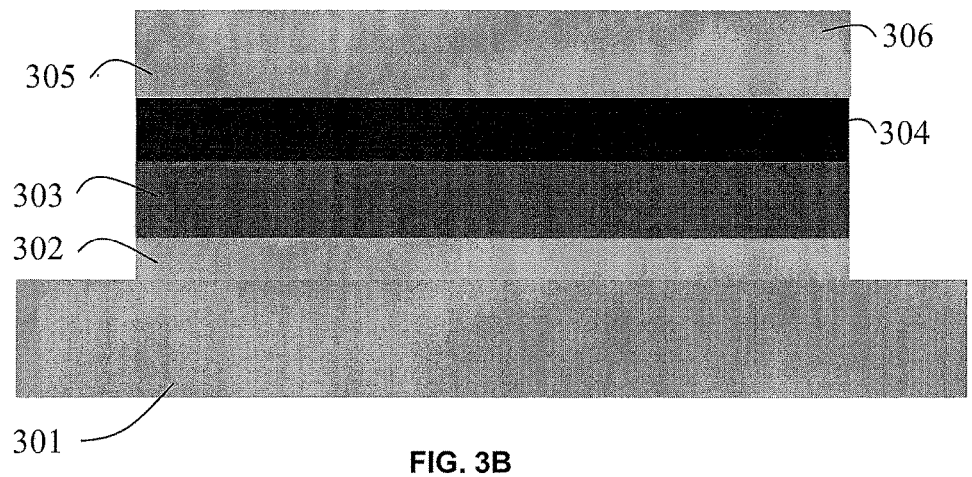
Figure 3C:
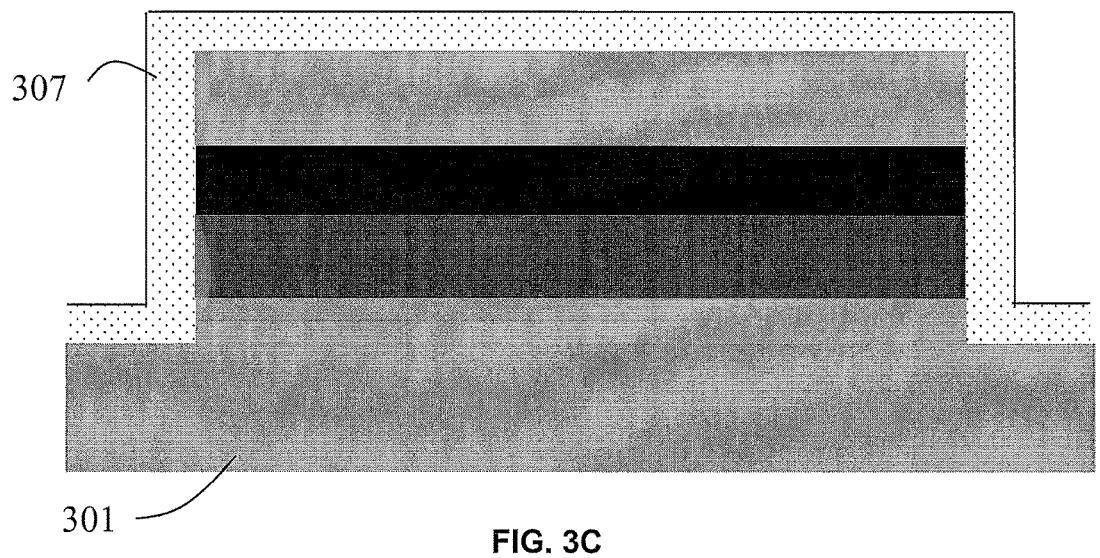
Figure 3D:
Figure 3E:
Figure 3F:
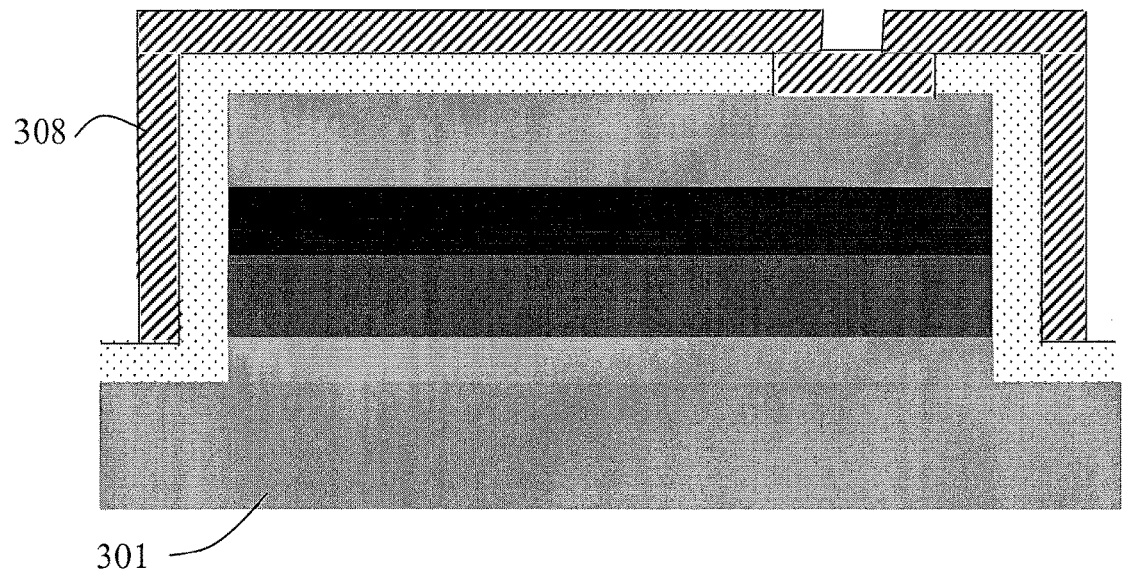

In more detail, as shown in the example of FIGS. 3A-3F, the process starts with providing an electrically conductive substrate 301, such as a stainless steel substrate. In FIG. 3A, blanket deposition of the following layers is shown on the substrate: CCC 302, cathode 303, electrolyte 304, anode 305 and ACC 306. Examples of the materials used for each of the layers are: Pt plus adhesion layer (such as Ti) or Ti/Au for the CCC; $LiCoO_2$ for the cathode; LiPON for the electrolyte; Li or Si for the anode; and Ti/Au or Cu for the ACC. The cathode may be annealed after cathode layer deposition—for example, the cathode may be annealed at 600° C. or more for 2 hours or more in order to develop a crystalline structure. Dry lithiation may take place during these steps if needed for non-Li anode cells. (For example, take a vanadium oxide cathode layer. If the counter electrode or anode is not Li, then the charge carrier will need to be added to the "system". This can be done using a so-called dry lithiation process. The process includes: depositing the cathode layer, and annealing if required; and depositing Li over the cathode. If a shadow-masked process is used for the cathode, then the same shadow mask can be used. The deposited lithium "reacts/intercalates" with the cathode layer, forming the lithiated cathode layer. The same general procedure can be followed for the anode side, if the anode side is another intercalation compound or composite/reaction based material, such as Sn and Si.) In FIG. 3B, laser die patterning can be used to form one or more separate devices (the figure shows only one device, however, multiple devices may be formed on a single substrate); the laser die patterning may be achieved by either front side or backside laser irradiation. In FIG. 3C, an encapsulation layer 307 is blanket deposited; the encapsulation layer may by a blanket dielectric or a polymer deposition or combination thereof, for example. In FIG. 3D, front side laser patterning can be used to remove the encapsulation layer to open up contact areas of the ACC. The steps of FIGS. 3C and 3D may be repeated to meet permeation barrier requirements. In FIG. 3E, a contact pad layer 308 is blanket deposited, the pad layer may be a metal such as Al or Cu for final connections to external circuits. In FIG. 3F, the pad is laser ablated from the dicing alleys; however, the encapsulation layer may be left on the substrate for better electrical isolation. Laser dicing can then be used to obtain separate devices. Furthermore, more protective layers (organic, dielectric or metal) may be deposited and patterned if needed.

According to some further embodiments of the present invention, a method of fabricating a thin film battery, may comprise: depositing a first stack of blanket layers on an electrically non-conductive substrate, the first stack comprising (optionally) a die patterning assistance layer, a cathode current collector layer, a cathode layer (annealing the layer as needed), an electrolyte layer, an anode layer and an anode current collector layer; laser die patterning the first stack to form one or more second stacks (each second stack forming the core of a separate TFB); blanket depositing an encapsulation layer over the one or more second stacks; laser patterning the encapsulation layer to open up anode contact areas to the ACC on each of the one or more second stacks; blanket depositing a metal pad layer over the encapsulation layer and the anode contact areas of the ACCs; laser patterning the metal pad layer to electrically isolate the ACCs of each of the one or more TFBs; and opening up, through the substrate, cathode contact areas on the cathode current collector for each of the one or more thin film batteries.

Figure 4C:
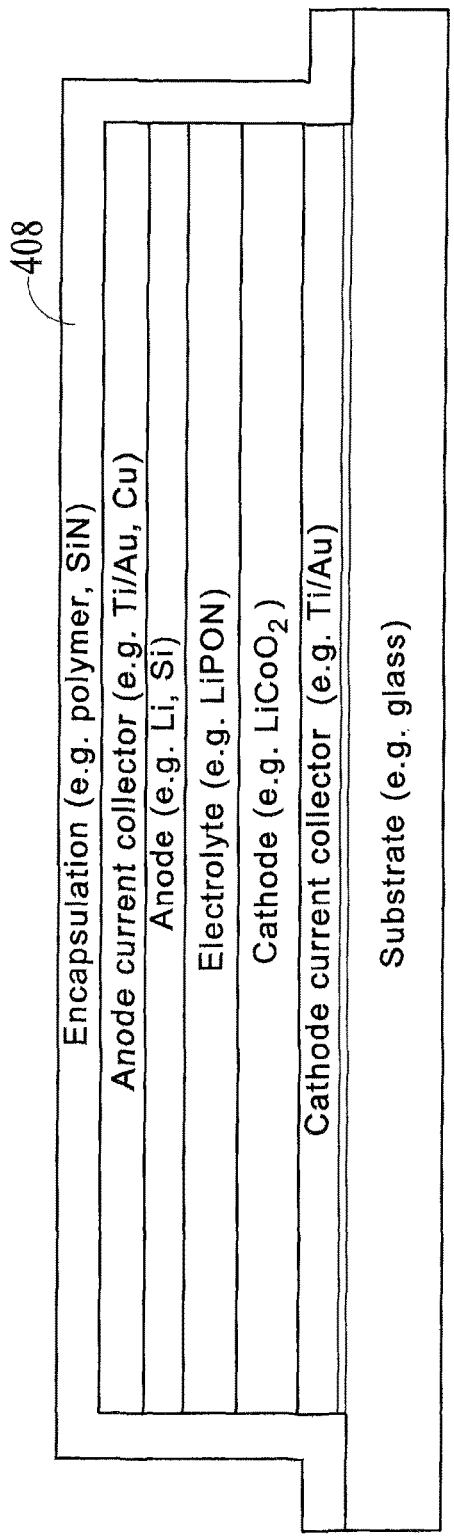
Figure 4D:
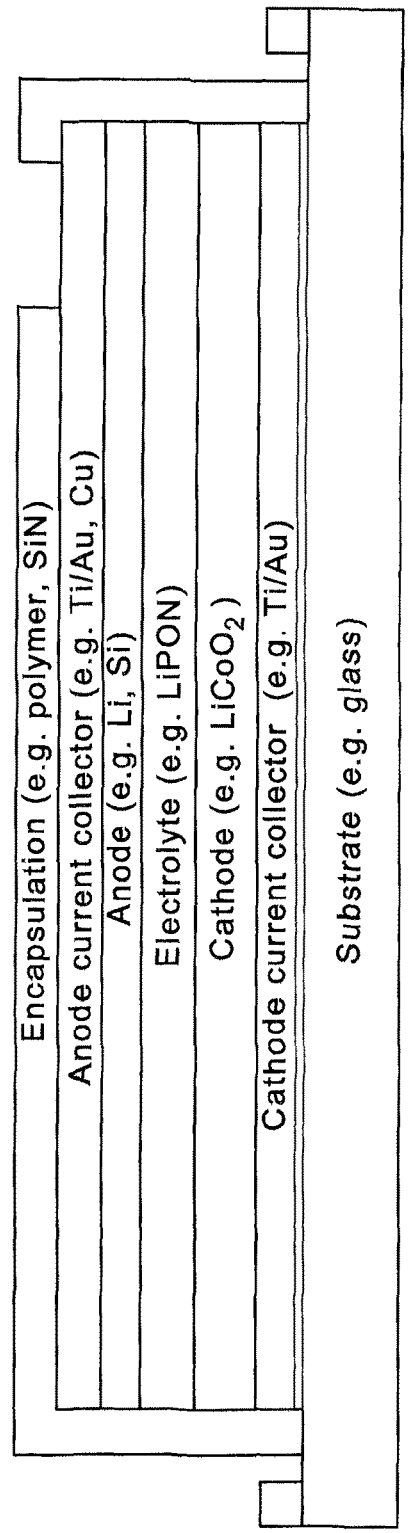
Figure 4E:
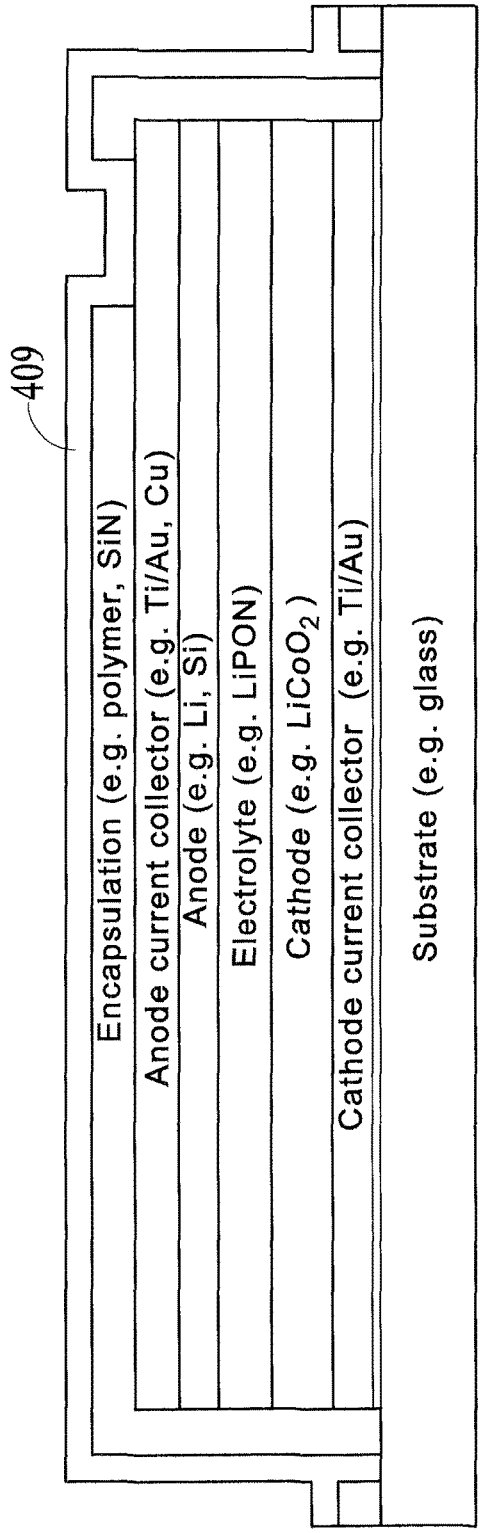
Figure 4F:
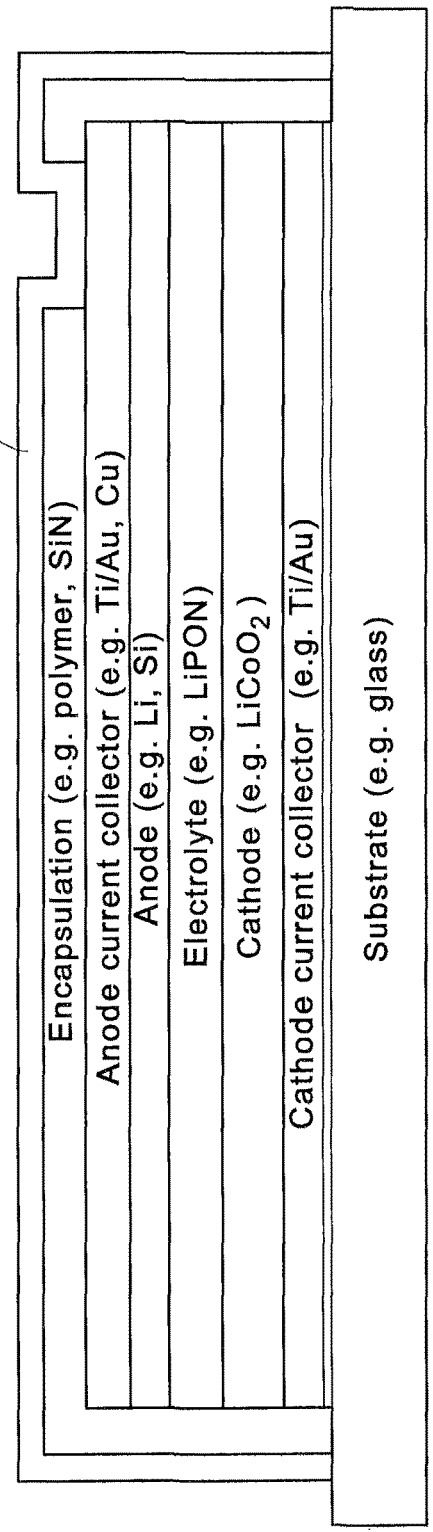
Figure 4G:
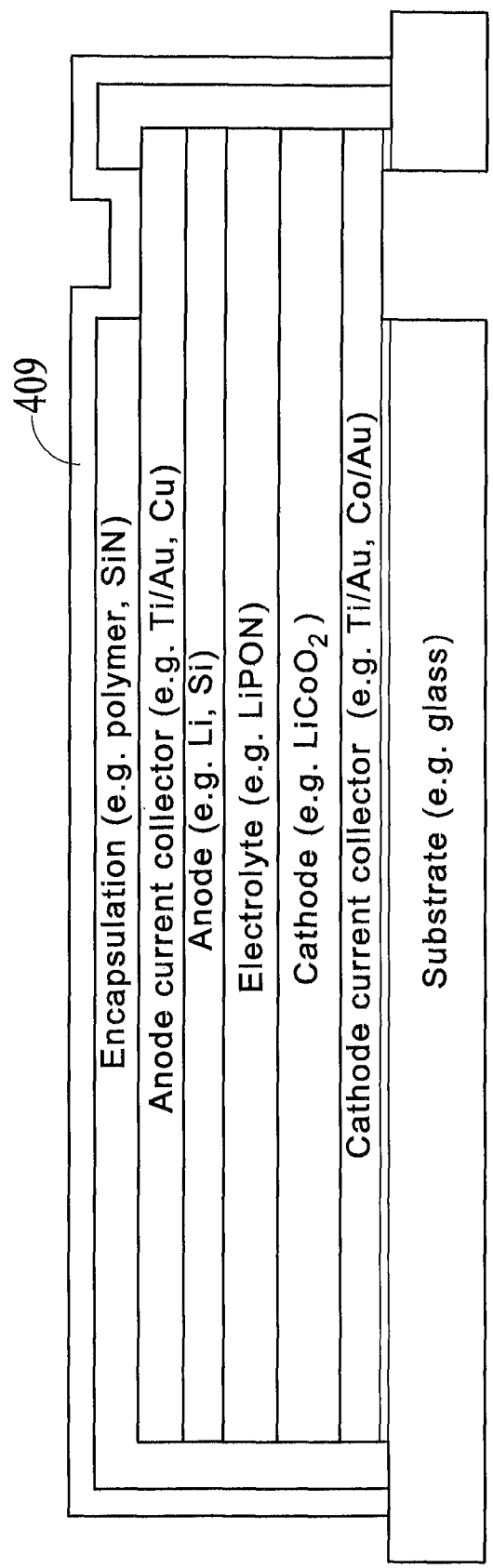

In more detail, as shown in the example of FIGS. 4A-4G, the process starts with providing an electrically non-conductive substrate 401, such as $Si_3N_4$/silicon, mica or glass, (Note that if a Si substrate is used, in order to make it "electrically non-conducting" a dielectric can be deposited on the surface prior to stack deposition, and a further laser ablation step will be needed to open the bottom contact after the step shown in FIG. 4G.) In FIG. 4A, blanket deposition of the following layers is shown on the substrate: die patterning assistance layer 402, CCC 403, cathode 404, electrolyte 405, anode 406 and ACC 407. Examples of the materials used for each of the layers are: an amorphous silicon (a-Si) layer or a microcrystalline silicon (μc-Si) layer for the die patterning assistance layer; Pt plus adhesion layer (such as Ti) or Ti/Au for the CCC; $LiCoO_2$ for the cathode; UPON for the electrolyte; Li or Si for the anode; and Ti/Au or Cu for the ACC. The cathode may be annealed after cathode layer deposition. Dry lithiation can take place during these steps if needed for non-Li anode cells. In FIG. 4B, laser die patterning can be used to form one or more separate devices (the figure shows only one device, however, multiple devices may be formed on a single substrate); the laser die patterning may be achieved by either front side or backside laser irradiation. In FIG. 4C, an encapsulation layer 408 is blanket deposited; the encapsulation layer may by a blanket dielectric or a polymer deposition, or combination thereof—for example SiN/polymer/SiN/polymer. In FIG. 4D, front side laser patterning is used to remove the encapsulation layer to open up contact areas of the ACC; furthermore, front or backside laser irradiation may be used to remove a thin strip of the encapsulation layer adjacent to the edge of the stack (roughly the thickness of the encapsulation layer away from the edge of the stack), although the rest of the encapsulation layer is left in the dicing alleys to assist in the dicing process. The width of the thin strip may be in the range of 10 microns to 1000 microns, in embodiments in the range of 10 microns to 500 microns, and in further embodiments in the range of 30 microns to 200 microns. (Note that the residual encapsulation layer on the dicing track may reduce defects resulting from cutting of the substrate material, and also serve as an alignment guideline.) The purpose of removing the encapsulation layer adjacent to the edge of the stack is so that the subsequent pad metal 409 deposition will function as an additional permeation blocking layer. In FIG. 4E, a contact pad layer 409 is blanket deposited, the pad layer may be a metal such as Al or Cu, (Contact pad layer 409 can be Cu when alloying with Li is to be avoided, such as when using a Li anode.) In FIG. 4F, the pad layer and encapsulation layer is laser ablated from the dicing alleys. To complete the processing two different process flows are provided as examples—the first is a laser-based process and the second is an etch-based process.

In the first process flow, the substrate is laser ablated to expose the CCC, as shown in FIG. 4G, allowing for backside contact to be made through the substrate. Typically, ultrafast lasers are used to etch through the substrate without damaging the CCC. Furthermore, the ultrafast laser fluence can be controlled to remove a layer at a rate of less than 50 Å per pulse when the laser removing process is close to the CCC, and thus minimize removal of CCC material. The backside contact can be made with another vacuum deposition or by applying conductive slurry or paste. Contact to an external circuit can be made with bonding technology or soldering. Dicing is normally done after backside contact establishment. Furthermore, more protective layers (organic, dielectric or metal) may be deposited and patterned if needed.

Figure 5A:
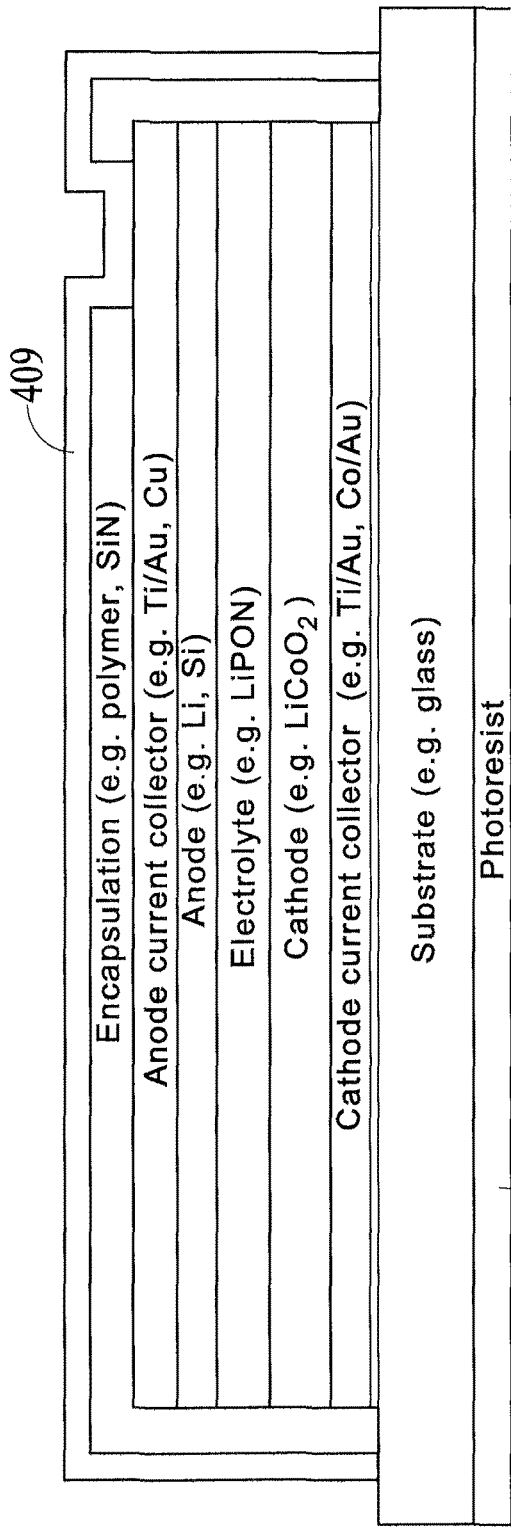
FIGS. 5A-5C are cross-sectional and plan view representations of sequential steps in a third process flow for fabrication of a vertical TFB with a non-conductive substrate, according to some embodiments of the present invention.
Figure 5B:
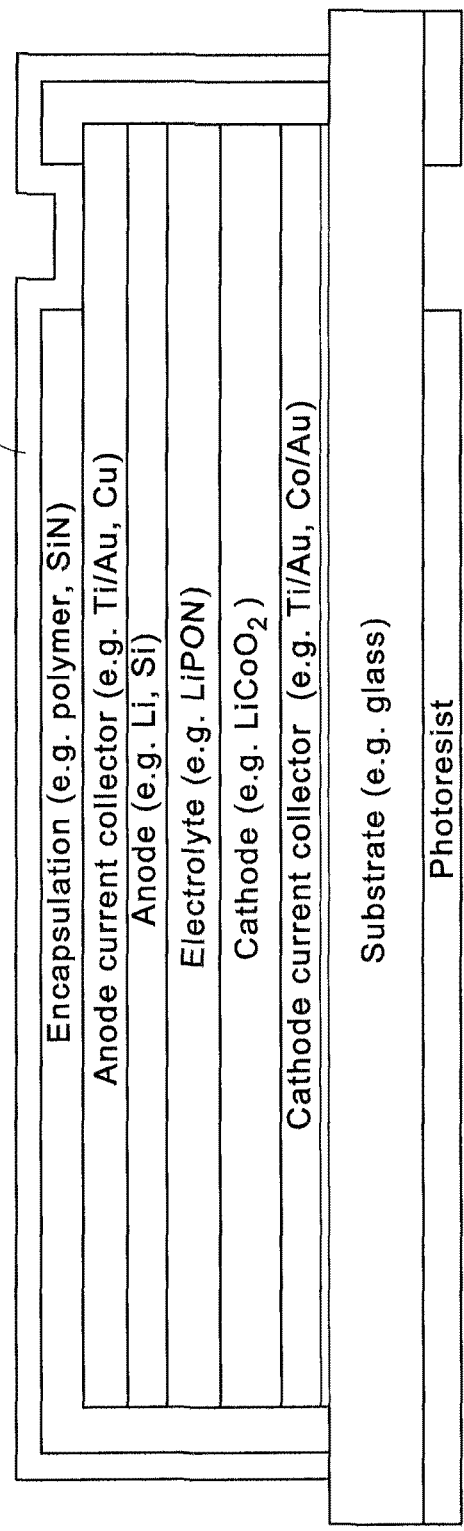
Figure 5C:
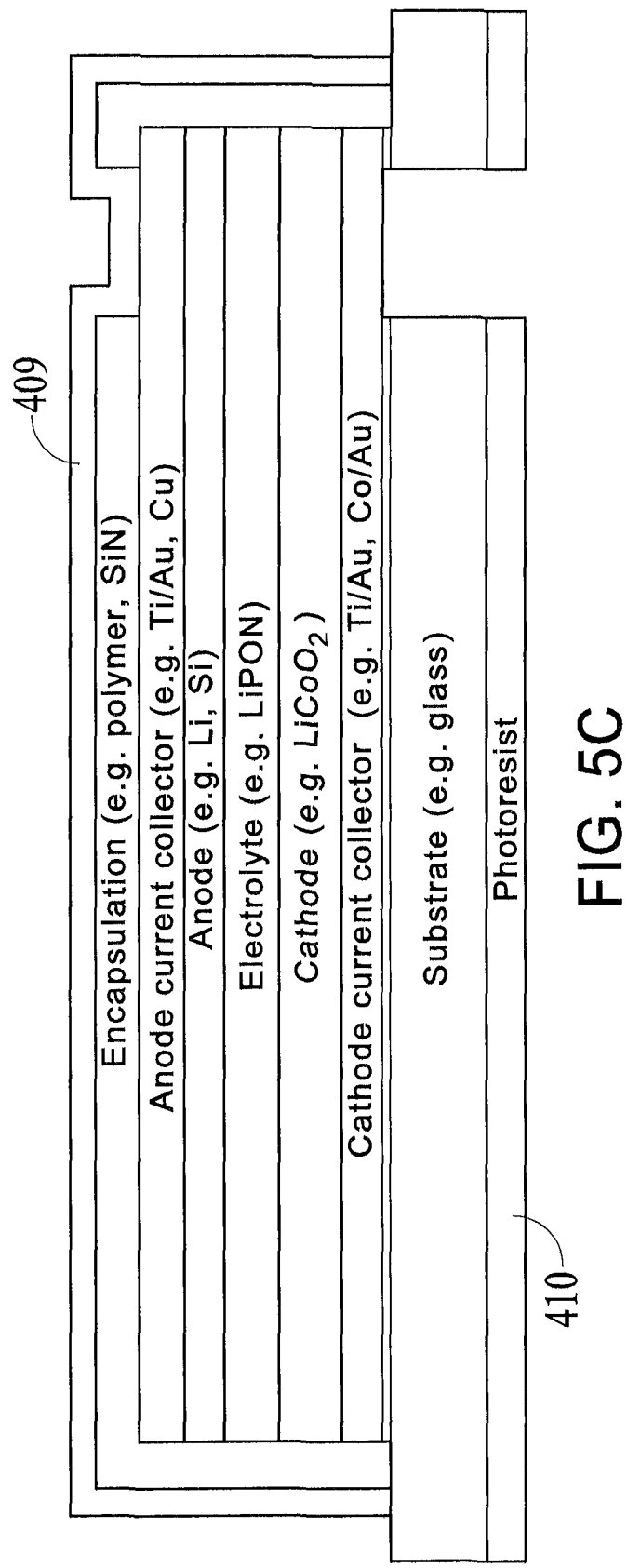

In a second process flow, starting with the structure of FIG. 4F, the device is flipped and photoresist 410 is spin coated on the backside of the substrate, as shown in FIG. 5A, In FIG. 5B, the photoresist (or some etchant resistant polymer) 410 is laser ablated to expose the substrate where a via is to be formed through to the CCC. More protective layers (dielectric, organic or metal) may be deposited and patterned at this point of this process, if desired. In FIG. 5C, the substrate is etched to form a via through to the CCC. Traditional dry and wet etch processes may be used to etch through the substrate and expose the CCC. Examples of etches for a glass substrate that are expected to be effective include: (1) buffered hydrofluoric acid solution—this etch is standard for $SiO_2$ and consists of 6 volumes of ammonium fluoride ($NH_4F$, 40% solution) and 1 volume of HF; (2) the so-called P-etch—60 volumes of $H_2O$+3 vol. of HF+2 vol. of $HNO_3$); and TMAH (tetramethylammonium hydroxide)—TMAH may provide very good etch selectivity to some metals. An example of an etch for a Si substrate that is expected to be effective is potassium hydroxide (KOH), although the crystallographic etch preference should be accounted for; furthermore, a suitable etch resistant polymer is needed since some photoresist materials do not hold up in KOH. Note that the polymer layer need not be removed and can function as a protective coating, although the removal of the layer may improve the volumetric energy density.

Further to the discussion of the die patterning assistance layer above, a more detailed description is provided as follows. When die patterning is from the substrate side—the laser beam passes through the substrate before reaching the deposited layers—a die patterning assistance layer, e.g. an amorphous silicon (a-Si) layer or a microcrystalline silicon (μc-Si) layer, may be used to achieve full stack die patterning/ablation indirectly by using the vapor pressure of the assistance layer without the separate melting/evaporation of the other stack layers, which greatly reduces the laser energy required to remove material and improves die patterning quality.

The laser processing and ablation patterns may be designed to form TFBs with identical device structures to those fabricated using masks, although more accurate edge placement may provide higher device densities and other design improvements. Higher yield and device density for TFBs over current shadow mask manufacturing processes are expected for some embodiments of processes of the present invention since using shadow masks in TFB fabrication processes is a likely source of yield killing defects and removing the shadow masks may remove these defects. It is also expected that some embodiments of processes of the present invention will provide better patterning accuracy than for shadow mask processes, which will allow higher TFB device densities on a substrate. Further, some embodiments of the present invention are expected to relax constraints on PVD processes (restricted to lower power and temperature in shadow mask deposition processes) caused by potential thermal expansion induced alignment issues of the shadow masks, and increase deposition rates of TFB layers.

Furthermore, taking shadow masks out of the TFB manufacturing process may reduce new manufacturing process costs by; eliminating mask aligner, mask management systems and mask cleaning; CoC (cost of consumables) reduction; and allowing use of industry proven processes—from the silicon integrated circuit and display industries. Blanket layer depositions and ex-situ laser patterning of TFBs may improve pattern accuracy, yields and substrate/material usages sufficiently to drive down the TFB manufacturing costs.

Conventional laser scribe or laser projection technology may be used for the selective laser patterning processes of the present invention. The number of lasers may be: one, for example a UV/VIS laser with picosecond or femtosecond pulse width (selectivity controlled by laser fluence/dose); two, for example a combination of UV/VIS and IR lasers (selectivity controlled by laser wavelength/fluence/dose); or multiple (selectivity controlled by laser wavelength/fluence/dose). The scanning methods of a laser scribe system may be stage movement, beam movement by Galvanometers or both. The laser spot size of a laser scribe system can be adjusted from 30 microns (mainly for die pattering) to 1 cm in size (diameter, diagonal or other characteristic length). The laser area at the substrate for a laser projection system can be 1 mm$^2$ or larger, where the energy distribution within the beam ideally has a top hat profile. Furthermore, other laser types and configurations may be used.

Note that the metal current collectors, both on the cathode and anode side, may need to function as protective barriers to the shuttling lithium ions. In addition, the anode current collector may need to function as a barrier to the oxidants ($H_2O$, $O_2$, $N_2$, etc.) from the ambient. Therefore, the material or materials of choice should have minimal reaction or miscibility in contact with lithium in "both directions"—i.e., the Li moving into the metallic current collector to form a solid solution and vice versa. In addition, the material chosen for the metallic current collector should have low reactivity and diffusivity to those oxidants. Based on published binary phase diagrams, some potential candidates for the first requirements are Ag, Al, Au, Ca, Cu, Co, Sn, Pd, Zn and Pt. With some materials, the thermal budget may need to be managed to ensure there is no reaction/diffusion between the metallic layers. If a single metal element is incapable of meeting both requirements, then alloys may be considered. Also, if a single layer is incapable of meeting both requirements, then dual (multiple) layers may be used. Furthermore, in addition an adhesion layer may be used in combination with a layer of one of the aforementioned refractory and non-oxidizing layers—for example, a Ti adhesion layer in combination with Au or Pt. The current collectors may be deposited by (pulsed) DC sputtering of metal targets to form the layers (e.g., metals such as Cu, Ag, Pd, Pt and Au, metal alloys, metalloids or carbon black). The stack of layers, including adhesion layers, etc., that form a current collector may typically be up to 500 nm thick. Furthermore, there are other options for forming the protective barriers to the shuttling lithium ions, such as dielectric layers, etc.

RF sputtering has been the traditional method for depositing the cathode layer (e.g., $LiCoO_2$) and electrolyte layer (e.g., $Li_3PO_4$ in $N_2$), which layers are both insulators (more so for the electrolyte). However, pulsed DC has also been used for $LiCoO_2$ deposition, as well as the pure DC method. Furthermore, other deposition techniques may be used, including application of a substrate bias. Yet furthermore, multiple frequency RF sputtering techniques may be used, for example as described in U.S. Patent Application Publication No. 2013/0248352 for Multiple Frequency Sputtering for Enhancement in Deposition Rate and Growth Kinetics of Dielectric Materials, published Sep. 26, 2013, The Li layer 305/406 can be formed using an evaporation or sputtering process. The Li layer can be a Li alloy, where the Li is alloyed with a metal such as tin or a semiconductor such as silicon, for example. The Li layer can be about 3 µm thick (as appropriate for the cathode and capacity balancing, and as a reservoir for degradation by permeating oxidants over the expected lifetime of the device) and the encapsulation layer 307/408 can be 3 µm or thicker. The encapsulation layer can be a multilayer of parylene/polymer and metal and/or dielectric. Note that, between the formation of the Li layer 305 and the encapsulation layer 307, the part must be kept in an inert environment, such as argon gas or (very) dry air; however, after blanket encapsulation layer deposition the requirement for an inert environment will be relaxed. The ACC 306/407 may be used to protect the Li layer allowing laser ablation outside of vacuum and the requirement for an inert environment may be relaxed. However, it may be best to still maintain such an ambient to minimize permeation of the oxidants.

Figure 6A:
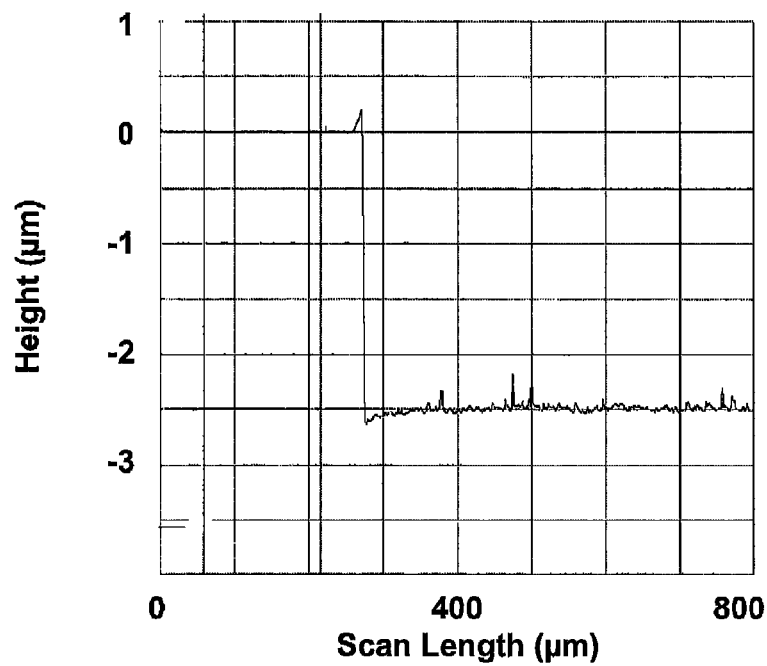
FIGS. 6A and 6B are profilometer traces across the edge of a vertical TFB patterned from the backside (substrate side) and front side (film side), respectively, of the substrate by a 532 nm nanosecond laser, according to some embodiments of the present invention.
Figure 6B:
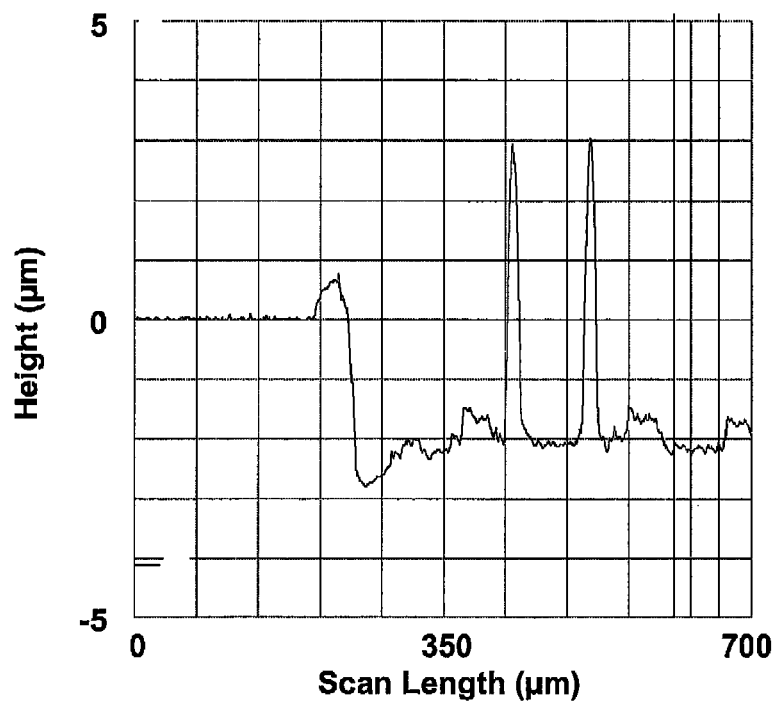

FIGS. 6A & 6B show profilometer traces across the edge of a laser patterned stack after die patterning, as described above. The laser patterning is from the backside—through the substrate—in FIG. 6A and from the front (film) side in FIG. 6B. The film stack in this specific example is Ti/Au/$LiCoO_2$ on a glass substrate, and all blanket stack layers were deposited by DC, pulsed magnetron. The laser used for ablation is a 532 nm nanosecond laser, with spot size around 40 microns. It is clear from FIG. 6A that there are very few spikes in the ablation region. This is in contrast to die patterning of the same stack from the film side using either a 532 nm or 1064 nm nanosecond laser, which results in an unacceptable amount of debris left in the ablation region, in the form of "spikes" of material—as seen in FIG. 6B, There are very few "spikes" in the ablation region if die patterning is from the substrate side, whereas there are many large "spikes" in the ablation region if die patterning is from the device side, Laser patterning from the substrate side is an explosion process prior to melting of "upper" layers, whereas pattering from the film side needs to ablate the full film stack. The required laser fluence from the substrate side is much less than from the film side, especially for multiple thick film stacks. In addition, laser pattering from the film side has to first melt and then vaporize all film stacks and melt expulsion forms the "spikes" left in the ablation region.

Furthermore, a very wide process window was experimentally observed for substrate side laser ablation using a 532 nm nanosecond laser with a PRF (pulse repetition frequency) of 30 kHz—variation of laser current over 24 to 30 A and variation of scanning speed from 400 to 1000 mm/s all showed excellent edge definition with no significant residue in the removal area.

Figure 7:
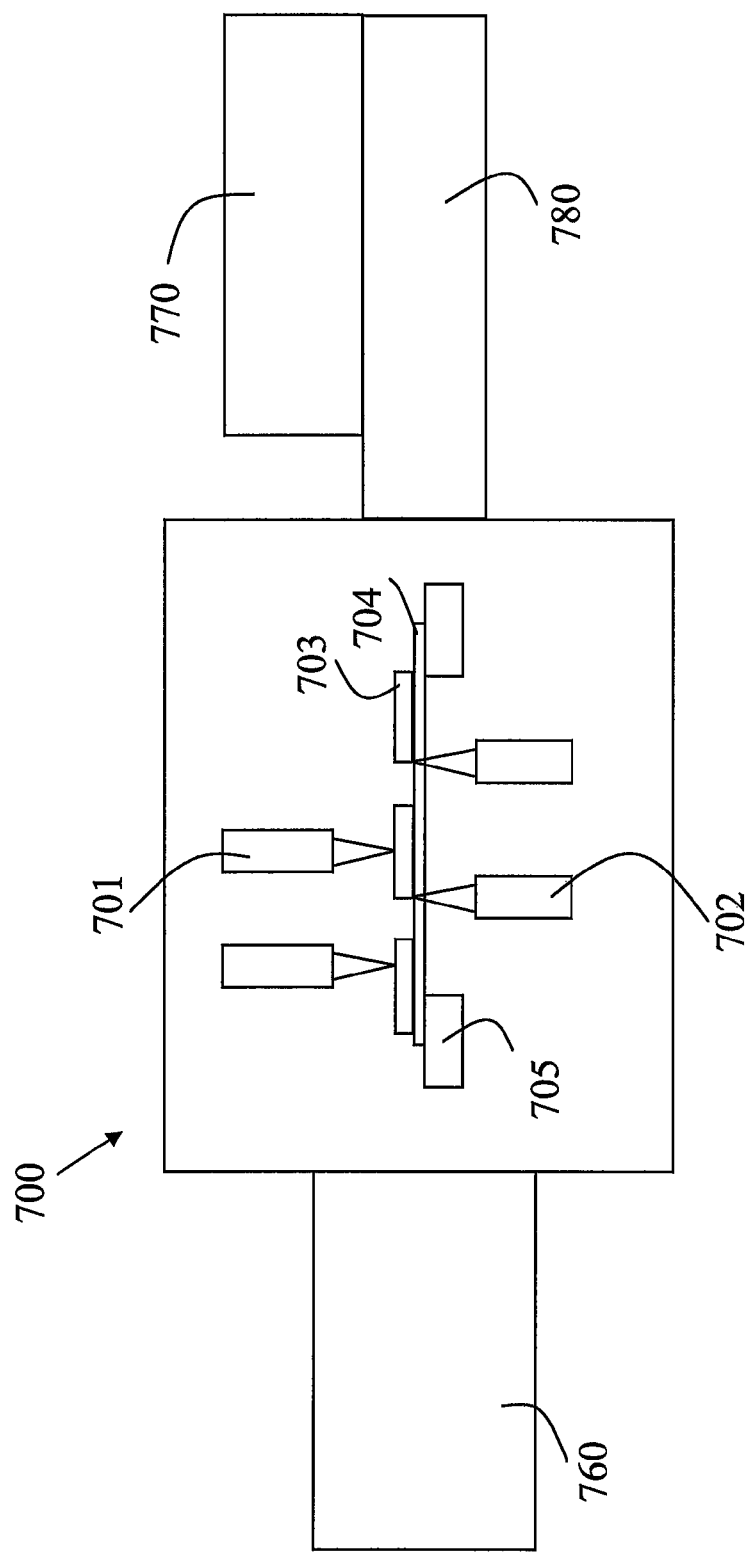
FIG. 7 is a schematic of a laser patterning tool, according to some embodiments of the present invention.

FIG. 7 is a schematic of a laser patterning tool 700, according to embodiments of the present invention. Tool 700 includes lasers 701 for patterning devices 703 on a substrate 704. Furthermore, lasers 702 for patterning through the substrate 704 are also shown, although lasers 701 may be used for patterning through the substrate 704 if the substrate is turned over, A substrate holder/stage 705 is provided for holding and/or moving the substrate 704. The stage 705 may have apertures to accommodate laser patterning through the substrate. Tool 700 may be configured for substrates to be stationary during laser ablation, or moving—the lasers 701/702 may also be fixed or movable; in some embodiments both the substrate and the lasers may be movable in which case the movement is coordinated by a control system. A stand-alone version of tool 700 is shown in FIG. 7, including an SMF 760 and also a glovebox 780 and antechamber 770. The embodiment shown in FIG. 7 is one example of a tool according to the present invention—many other configurations of the tool are envisaged, for example, the glove box may not be necessary in the case of lithium-free TFBs. Furthermore, the tool 700 may be located in a room with a suitable ambient, like a dry-room as used in lithium foil manufacturing.

Figure 8:
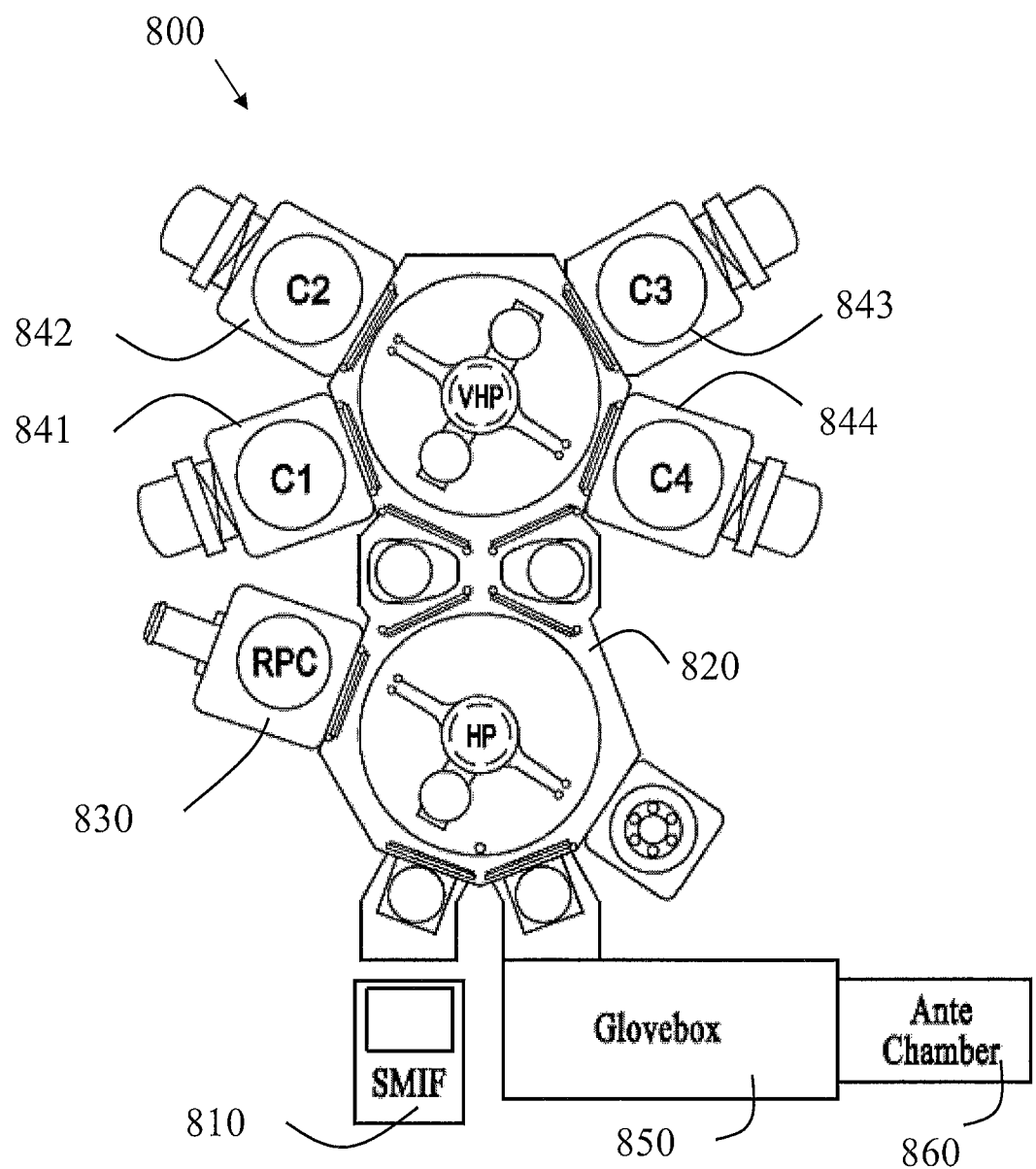
FIG. 8 is a schematic illustration of a thin film deposition cluster tool for vertical TFB fabrication, according to some embodiments of the present invention.

FIG. 8 is a schematic illustration of a processing system 800 for fabricating a TFB device according to some embodiments of the present invention. The processing system 800 includes a standard mechanical interface (SMIF) 810 to a cluster tool 820 equipped with a standard or reactive plasma clean (PC or RPC) chamber 830 and process chambers C1-C4 (841-844), which may be utilized in the process steps described above. A glovebox 850 may also be attached to the cluster tool if needed. The glovebox can store substrates in an inert environment (for example, under a noble gas such as He, Ne or Ar), which is useful after alkali metal/alkaline earth metal deposition. An ante chamber 860 to the glovebox may also be used if needed—the ante chamber is a gas exchange chamber (inert gas to air and vice versa) which allows substrates to be transferred in and out of the glovebox without contaminating the inert environment in the glovebox. (Note that a glovebox can be replaced with a dry room ambient of sufficiently low dew point as such is used by lithium foil manufacturers.) The chambers C1-C4 can be configured for process steps for manufacturing thin film battery devices which may include: deposition of a cathode layer (e.g. $LiCoO_2$ by RF sputtering); deposition of an electrolyte layer (e.g. $Li_3PO_4$ by RF sputtering in $N_2$); deposition of an alkali metal or alkaline earth metal; and selective laser patterning of blanket layers. Examples of suitable cluster tool platforms include AKT's display cluster tools, such as the Generation 10 display cluster tools or Applied Material's Endura™ and Centura™ for smaller substrates. The annealing requirement can be met with a conventional furnace and radiation heating, including the microwave annealing described in U.S. Patent Application Publication No. 2013/0266741 for Microwave Rapid Thermal Processing of Electrochemical Devices, published Oct. 10, 2013. It is to be understood that while a cluster arrangement has been shown for the processing system 800, a linear system may be utilized in which the processing chambers are arranged in a line without a transfer chamber so that the substrate continuously moves from one chamber to the next chamber.

Figure 9:
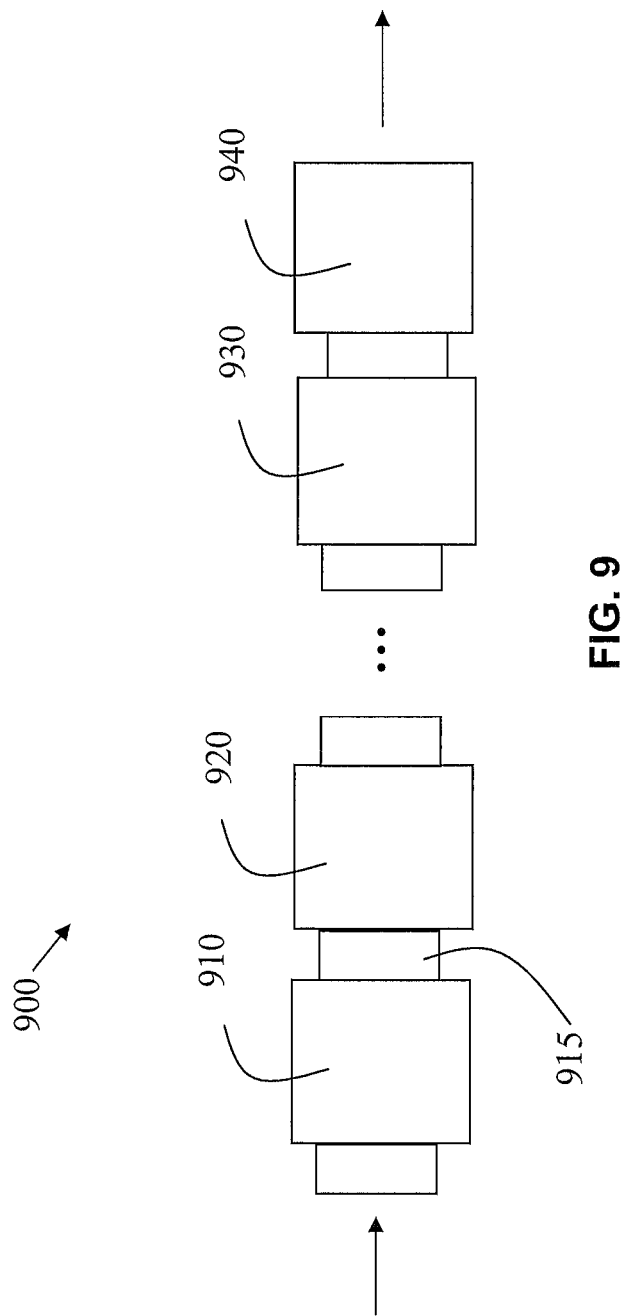
FIG. 9 is a representation of a thin film deposition system with multiple in-line tools for vertical TFB fabrication, according to some embodiments of the present invention.

FIG. 9 shows a representation of an in-line fabrication system 900 with multiple in-line tools 910, 920, 930, 940, etc., according to some embodiments of the present invention. In-line tools may include tools for depositing and patterning all the layers of a TFB device. Furthermore, the in-line tools may include pre- and post-conditioning chambers. For example, tool 910 may be a pump down chamber for establishing a vacuum prior to the substrate moving through a vacuum airlock 915 into a deposition tool 920. Some or all of the in-line tools may be vacuum tools separated by vacuum airlocks 915. Note that the order of process tools and specific process tools in the process line will be determined by the particular TFB device fabrication method being used—four specific examples of which are provided above. Furthermore, substrates may be moved through the in-line fabrication system oriented either horizontally or vertically. Yet furthermore, selective laser patterning modules may be configured for substrates to be stationary during laser ablation, or moving.

Figure 10:
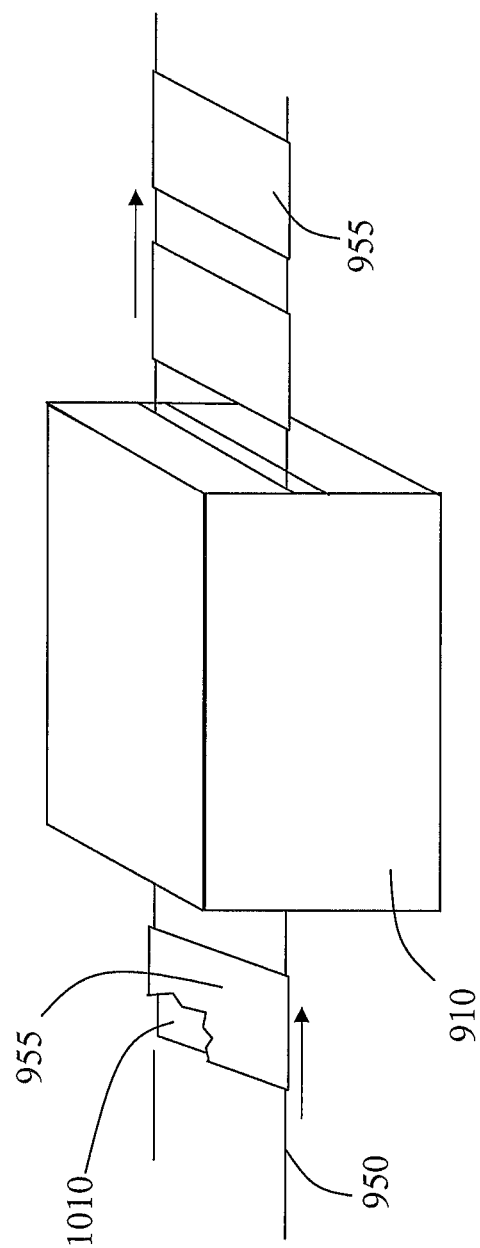
FIG. 10 is a representation of an in-line deposition tool for vertical TFB fabrication, according to some embodiments of the present invention.

In order to illustrate the movement of a substrate through an in-line fabrication system such as shown in FIG. 9, in FIG. 10 a substrate conveyer 1050 is shown with only one in-line tool 910 in place. A substrate holder 955 containing a substrate 1010 (the substrate holder is shown partially cut-away so that the substrate can be seen) is mounted on the conveyer 950, or equivalent device, for moving the holder and substrate through the in-line tool 910, as indicated. Suitable in-line platforms for processing tool 910 may be Applied Material's Aton™ and New Aristo™.

An apparatus for forming thin film batteries according to embodiments of the present invention may comprise: a first system for blanket depositing on a substrate a first stack including a cathode current collector layer, a cathode layer (annealing the layer as needed), an electrolyte layer, an anode layer and an anode current collector layer; a second system for laser die patterning the first stack to form one or more second stacks, each second stack forming the core of a separate thin film battery; a third system for blanket depositing an encapsulation layer over the one or more second stacks; a fourth system for laser patterning the encapsulation layer to open up anode contact areas to the anode current collectors on each of the one or more second stacks; a fifth system for blanket depositing a metal pad layer over the encapsulation layer and the anode contact areas; and a sixth system for laser patterning the metal pad layer to electrically isolate the anode current collectors of each of the one or more thin film batteries. If required, a seventh system may be used for cathode annealing, or annealing may be done in-situ in the first system. Furthermore, when a non-conductive substrate is used a further system—such as a laser ablation system and/or etch system—may be needed for opening up, through the substrate, cathode contact areas on the cathode current collector for each of the one or more thin film batteries. The systems may be cluster tools, in-line tools, stand-alone tools, or a combination of one or more of the aforesaid tools. Furthermore, the systems may include some tools which are common to one or more of the other systems—for example, one laser patterning tool may be used for more than one of the laser patterning steps.

Although the present invention has been described herein with reference to TFBs, the teaching and principles of the present invention may also be applied to improved methods for fabricating other electrochemical devices, including electrochromic devices.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of fabricating a thin film battery comprising:
depositing a first stack of blanket layers on the top surface of an electrically non-conductive substrate, the first stack comprising a cathode current collector layer, a cathode layer, an electrolyte layer, an anode layer and an anode current Collector layer, followed by laser die patterning said first stack to form one or more second stacks, each second stack forming a core of a separate thin film battery;
blanket depositing an encapsulation layer over said one or more second stacks;
laser patterning said encapsulation layer to open up anode contact areas to the anode current collectors on each of said one or more second stacks;
blanket depositing a metal pad layer over said encapsulation layer and said anode contact areas;
laser patterning said metal pad layer to electrically isolate the anode current collectors of each of said one or more thin film batteries; and
opening up, through said electrically non-conductive substrate, cathode contact areas on the cathode current collector for each of said one or more thin film batteries.

2. The method of claim 1, wherein said anode layer is a lithium layer.

3. The method of claim 1, wherein said opening up cathode contact areas includes laser ablating said electrically non-conductive substrate.

4. The method of claim 1, wherein said laser patterning said encapsulation layer further includes removing strips of said encapsulation layer completely around and adjacent to the edges of said second stacks, said strips being roughly the thickness of said encapsulation layer away from the edges of said second stacks.

5. The method of claim 1, further comprising annealing said cathode layer.

6. The method of claim 1, wherein said first stack further comprises a die patterning assistance layer between said electrically non-conductive substrate and said cathode current collector layer.

7. The method of claim 6, wherein said die patterning assistance layer is an amorphous silicon layer.

8. The method of claim 1, wherein said opening up cathode contact areas includes:
   depositing resist over the bottom surface of said substrate;
   removing portions of said resist to expose areas of the bottom surface of said substrate; and
   etching through said electrically non-conductive substrate at the exposed areas to expose said cathode contact areas.

9. The method of claim 8, wherein said resist is photoresist.

10. The method of claim 8, wherein said etching is wet etching.

* * * * *

UNITED STATES PATENT AND TRADEMARK OFFICE
CERTIFICATE OF CORRECTION

PATENT NO. : 9,768,450 B2
APPLICATION NO. : 14/653730
DATED : September 19, 2017
INVENTOR(S) : Song et al.

It is certified that error appears in the above-identified patent and that said Letters Patent is hereby corrected as shown below:

In the Specification

In Column 6, Line 60, delete "glass," and insert -- glass. --, therefor.

In Column 7, Line 36, delete "Cu," and insert -- Cu. --, therefor.

In Column 7, Line 59, delete "FIG. 5A," and insert -- FIG. 5A. --, therefor.

In Column 8, Line 50, delete "cost by;" and insert -- cost by: --, therefor.

In Column 9, Line 51, delete "2013," and insert -- 2013. --, therefor.

In Column 10, Line 17, delete "FIG. 6B," and insert -- FIG. 6B. --, therefor.

In Column 10, Line 21, delete "side," and insert -- side. --, therefor.

In Column 10, Line 42, delete "over," and insert -- over. --, therefor.

In the Claims

In Column 12, Line 42, in Claim 1, delete "Collector" and insert -- collector --, therefor.

Signed and Sealed this
Twenty-eighth Day of November, 2017

Joseph Matal
*Performing the Functions and Duties of the
Under Secretary of Commerce for Intellectual Property and
Director of the United States Patent and Trademark Office*